United States Patent [19]

Scott et al.

[11] 3,879,613

[45] Apr. 22, 1975

[54] METHODS OF MANUFACTURING SEMICONDUCTOR DEVICES

[75] Inventors: Julian Portway Scott; Julian Robert Anthony Beale, both of Salfords, England

[73] Assignee: U.S. Philips Corporation, New York, N.Y.

[22] Filed: May 9, 1974

[21] Appl. No.: 468,248

Related U.S. Application Data

[63] Continuation of Ser. No. 312,848, Dec. 7, 1972, abandoned.

[30] Foreign Application Priority Data

Dec. 13, 1971 United Kingdom ............... 57769/71

[52] U.S. Cl. ........... 250/492; 148/1.5 CP; 250/398; 250/400

[51] Int. Cl. ........................................... H01j 37/26

[58] Field of Search .......... 148/1.5 CP; 219/121 EB, 219/121 EM; 250/398, 400, 492 A; 313/65 AB; 315/3

[56] References Cited

UNITED STATES PATENTS 3,710,101 1/1973 O'Keefe et al. ..................... 250/492

*Primary Examiner*—James W. Lawrence
*Assistant Examiner*—T. N. Grigsby
*Attorney, Agent, or Firm*—Frank R. Trifari

[57] ABSTRACT

A method of aligning a semiconductor body with respect to an electron beam pattern, comprising for each direction with respect to which alignment is desired, the steps of: forming on the semiconductor body a reference marker having two outer regions of one conductivity type semiconductor material separated by an intermediate region of opposite conductivity type semiconductor material; forming an alignment electron beam positionally fixed relative to the electron beam pattern and suitably cross-sectioned such that when the electron beam pattern is aligned with respect to the semiconductor body, said alignment electron beam strikes said intermediate region midway between said two outer regions causing thereby equal currents diffusing thereto from each of said two outer regions; comparing the currents diffusing into said intermediate region from each of said two outer regions; and adjusting the relative position of the electron beam pattern with respect to the semiconductor body until said compared currents are equal.

18 Claims, 8 Drawing Figures

METHODS OF MANUFACTURING SEMICONDUCTOR DEVICES

This is a continuation of application Ser. No. 312,848, filed Dec. 7, 1972, now abandoned.

This invention relates to methods of manufacturing semiconductor devices wherein at or adjacent a surface of a semiconductor body a process is affected with the aid of an electron beam.

Electron beam technology can be applied to semiconductor device manufacture in various ways and its application is becoming of particular importance in the manufacture of planar semiconductor devices including transistors and semiconductor integrated circuits.

It is already known to define a pattern in an electron resist by selective electron beam irradiation of the resist using a pattern mask. This pattern can then be used to define a pattern on an underlying insulating layer or metal layer on a semiconductor body.

For planar processing in which a series of diffusion steps are to be performed at a surface of a semiconductor body, each diffusion step is carried out by introducing an impurity into openings present in an insulating layer on the surface. These openings can be formed by a method which involves exposure of an electron resist formed over the insulating layer to an electron beam pattern which is defined by a pattern mask, followed by processing of the electron resist to remove portions thereof as determined by the electron beam irradiation expose corresponding portions of the insulating layer that are then eteched away to define the required openings. The formation of very precise openings having very small line widths can be provided in this way. Thus, a plurality of pattern masks is required for a plurality of diffusion steps. To obtain a good yield of devices of reasonable quality, it is essential that there is accurate alignment of the semiconductor body with respect to each electron beam pattern (as provided by its respective mask) for successive exposures. Such alignment may be achieved by providing at the surface of the semiconductor body at least one reference marker which can produce an error signal, which is indicative of any positional error between each electron beam pattern and the semiconductor body, in response to irradiation of the reference marker by the electron beam from an aligning aperture in each mask. This error signal can then be used to control the positional correction which is necessary, suitably by causing an appropriate deflection of the electron beam pattern rather than causing any physical relative movement of the semiconductor body and/or the mask concerned.

Various forms of such reference markers have already been proposed. In one form, diffused regions in the semiconductor body have been used as individual reference markers. An error signal from such a marker region is a function of secondary electron emission or scattered primary electrons resulting from the charging of the region by the electron beam. However, the use of these individual marker regions is not entirely satisfactory because during subsequent diffusion steps their extent and characteristics change due to the high temperatures involved in diffusion. Therefore, precise alignment for the subsequent diffusion steps becomes progressively more difficult to achieve.

The present invention proposes an improved way of achieving precise alignment using marker regions in the above circumstances.

According to the invention in a method of manufacturing a semiconductor device wherein at or adjacent a surface of a semiconductor body a process is effected with the aid of an electron beam, at least one reference marker is provided at said surface for controlling the alignment of the semiconductor body with respect to a pattern of the electron beam as projected by a mask onto said surface, said reference marker comprising two outer regions of one conductivity type semiconductor material separated by an intermediate region of opposite conductivity type semiconductor material, and the arrangement being such that irradiation of said intermediate region by the electron beam from an aligning aperture in said mask will cause current to diffuse to said outer regions in respective proportions to the distances from each of these regions of the point of irradiation of said intermediate region, the difference between said currents providing an error signal indicative of misalignment between said semiconductor body and the electron beam pattern.

Preferably, said outer regions of the reference marker are impurity regions which are diffused into the semiconductor body at spaced apart positions, with that portion of the semiconductor body between them forming said intermediate region of the reference marker. Conveniently, said outer regions can be defined and diffused in as part of the first diffusion step in the manufacture of the semiconductor device.

Thus, in carrying out the invention in respect of a semiconductor body of n-type material, said reference marker can consist of two diffused p-type regions separated by an intermediate n-type region, which latter is formed by the spacing of the two type regions on the semiconductor body. High voltage electrons from the electron beam striking the n-type region between the p-type regions will create many holes which diffuse mainly to the nearer p-type region. The hole current flowing in the two p-type regions is equal when the electron beam strikes the n-type region midway between them. It has been found that the diffusion of the hole current to the two p-type regions is determined principally by the spacing between them and is not limited by long diffusion times.

Ideally, the reference marker should form a symmetrical arrangement comprising two substantially identical outer regions, so that the accuracy of the offbalance or error signal which it can provide is unaffected by subsequent diffusion steps because each diffused outer region will then change its extent and character in exactly the same way as the other during these steps.

Preferably, a plurality of reference markers is provided on the semiconductor body. For instance, in the case where the semiconductor body is a round slice, four reference markers can be provided with 90° spacing between them at the periphery of the slice. A suitable shape for each outer region of the or each reference marker is rectangular with an offset portion at one end to which a metal contact is applied to enable electrical connection to be made to the region.

In order that the invention may be more fully understood reference will now be made by way of example to the accompanying drawings of which:

Figure 1:
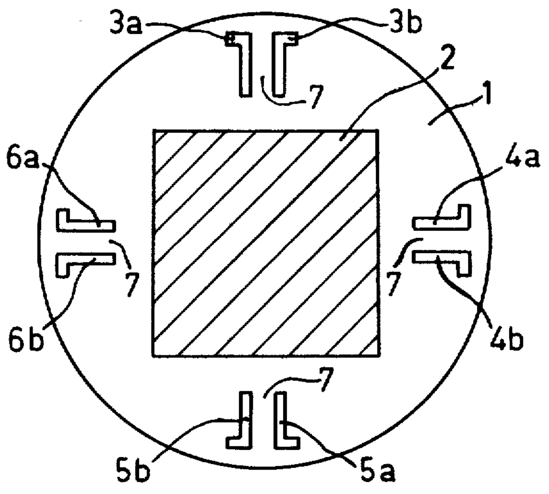
FIG. 1 shows diagrammatically and not to scale a round semiconductor slice which is provided with a plurality of reference markers.

Referring to the drawings, in FIG. 1 there is shown a plan view of a round semiconductor slice 1 which is assumed to be an n-type silicon slice. The shaded region 2 of the slice 1 represents the region on the slice at which individual transistor assemblies or other semiconductor devices are being formed by electron beam processing in known manner. Around the periphery of the slice 1 are provided four pairs of p-type regions 3a, 3b, 4a, 4b, 5a, 5b and 6a, 6b which, conveniently, are defined and diffused in as part of the first diffusion step in the manufacture of the semiconductor devices. For the sake of clarity, these p-type regions are shown much larger than they would actually be in practice. For instance, for a silicon slice 3 inches in diameter, typical dimensions for each p-type region would be 100 microns long and 20 microns wide, with a gap of 5 microns between the two p-type regions of each pair. Also, the region represented by the shaded region 2 at which semiconductor devices are being formed would extend over as much of the surface of the silicon slice as possible to avoid wastage.

Figure 2:
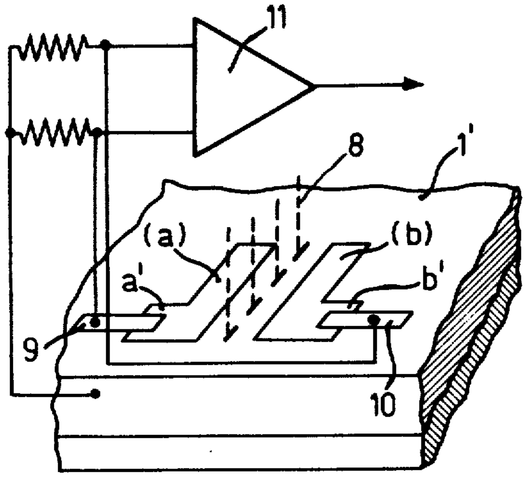
FIG. 2 shows diagrammatically an arrangement for deriving an error signal from a reference marker.

Each of the pairs of p-type regions 3a, 3b to 6a, 6b forms, in conjunction with the individual n-type silicon slice region 7 which is intermediate each pair, a reference marker for controlling the alignment of the silicon slice 1 with respect to an electron beam pattern as projected by a mask onto the surface of the silicon slice 1 to effect electron beam processing in the region 2. The arrangement for each reference marker is shown in FIG. 2 in which a fragmentary peripheral portion 1' of the silicon slice with one pair of p-type regions (*a*) and (*b*) thereon is represented.

There is provided in each electron beam pattern mask an aligning aperture in respect of each reference marker. Each aligning aperture is in the form of a narrow slit so that, as illustrated in FIG. 2, a narrow stream of electrons 8 is projected onto the intermediate region 7 of the appertaining reference marker when the electron beam pattern from the mask and the silicon slice 1 are in alignment or approximately so. The width of the electron stream 8 is much less than that of the intermediate region 7 and is suitably 1 micron.

Figure 3:
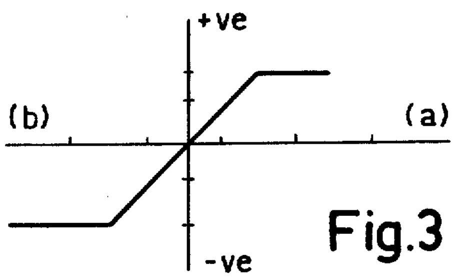
FIG. 3 shows a curve of the error signal misalignment.

High voltage electrons from the electron stream 8 striking the intermediate n-type region 7 will create many holes which diffuse mainly to the nearer p-type region (*a*) or (*b*). In fact, it has been found that the currents in the two p-type regions are in respective proportions to the distances from each region of the point of irradiation of the region 7 by the electron stream 8. The hole current flowing in the two p-type regions (*a*) and (*b*) is equal when the electron stream 8 strikes the region 7 midway between them. Metal contacts 9 and 10 afford electrical connection to offset portions *a'* and *b'* respectively of the p-type regions (*a*) and (*b*), these metal contacts being provided in known manner, for instance by vacuum deposition techniques. The two inputs of a differential amplifier 11 are connected respectively to the two metal contacts *a'*, *b'*, so that this amplifier will produce an output which is a function of the difference between the current flowing in the two p-type regions (*a*) and (*b* ). Thus the output from the amplifier 11 can be considered as an error signal which is indicative of misalignment between the silicon slice 1 and the electron beam pattern. As shown by the curve in FIG. 3, the error signal will be positive or negative at a maximum value when the electron stream 8 is immediately adjacent the region (*a*) or the region (*b*), or vice versa, and will reduce (or increase) to zero value when the electron stream 8 is exactly midway between the two p-type regions. Experiment has shown that a 1nA excitation from the electron beam (i.e. the electron stream 8) can produce a current of up to 10$\mu$A in each of the regions (*a*) and (*b*) when the n-type region 7 is irradiated at its mid position.

Figure 4A:
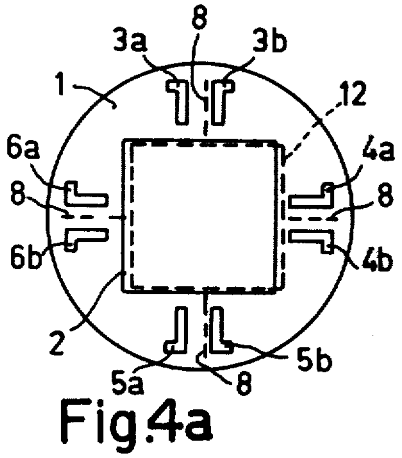
FIGS. 4a to 4d illustrate the principle of alignment using reference markers.
Figure 4B:
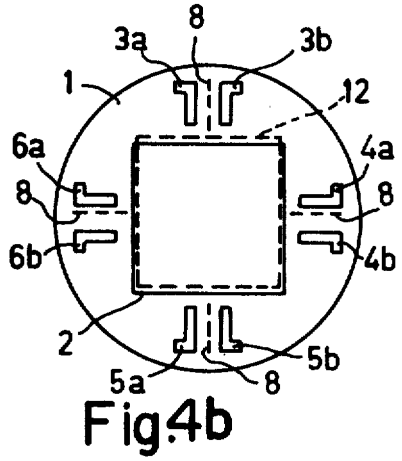
Figure 4C:
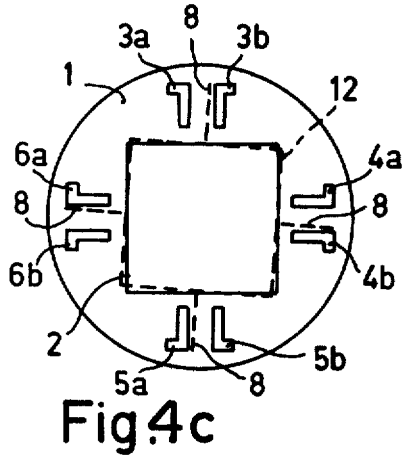
Figure 4D:
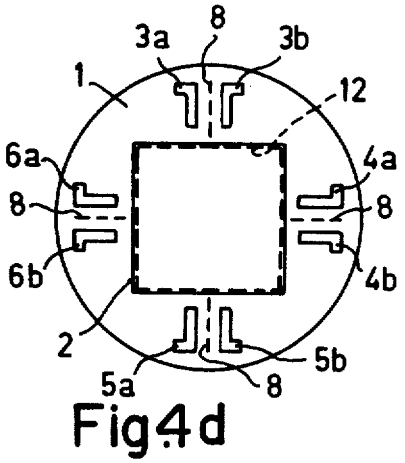

In theory, a single reference marker might suffice to provide a single error signal indicative of misalignment between the silicon slice 1 and the electron beam pattern. However, in practice, it has been found more convenient to provide a number of reference markers, four being a suitable number as shown in the example being described, because the direction and extent of any misalignment is more accurately indicated by a number of error signals. FIGS. 4a to 4d illustrate respective relative positions of the region 2 of the silicon slice 1 with respect to an electron beam pattern which is represented by the broken line region 12. In FIG. 4a, the electron beam pattern 12 is offset linearly to the right (as seen in the drawing) of the region 2. Thus unequal currents flow in the two p-type regions of each of the marker region pairs 3a, 3b and 5a, 5b, because in each of these reference markers the electron stream 8 strikes the intermediate n-type region 7 at an off-centre position. Therefore, an error signal indicative of this misalignment between the region 2 and the electron beam pattern 12 is produced by the differential amplifier 11 for each of these reference markers. The error signal is zero from the differential amplifier for each of the reference markers having the region pairs 4a, 4b and 6a, 6b, because the electron stream 8 strikes the n-type region 7 midway between each of these latter pairs. In FIG. 4b, the electron beam pattern 12 is offset linearly upwards (as seen in the drawing) with respect to the region 2. Thus, in this instance, unequal currents flow in the two p-type regions of each of the marker region pairs 4a, 4b and 6a, 6b to cause the production of an error signal indicative of this misalignment from the differential amplifier for each of the reference markers having these marker region pairs. The error signal is now zero from the differential amplifier for each of the reference markers having the region pairs 3a, 3b and 5a, 5b. In FIG. 4c, the electron beam pattern 12 is off set angularly or rotationally with respect to the region 2. As a result, an error signal indicative of this misalignment is produced from the differential amplifier for each of the reference markers because in each of them the electron stream 8 strikes the n-type region 7 at an off-centre position. In view of the relatively short length of each n-type region 7 (e.g., 100 microns) compared with the diameter (e.g., 3 inches) of the silicon slice 1, any angular displacement of the electron stream 8 from the mid-position of the appertaining n-type region 7 and within the boundary of this region can be considered to be linear displacement which is normal to the mid-position. When there is current alignment between the electron beam pattern 12 and the region 2 as illustrated in FIG. 4*d*, the electron stream 8 strikes the n-type region 7 midway between the marker region pairs of each reference marker so that the error signal is zero from the differential amplifier for each reference marker.

The error signals which are produced by the reference markers are used to correct the misalignment between the electron beam pattern and the silicon slice 1. Preferably, the correction is achieved electrically, rather than by mechanical adjustment of the position of the silicon slice and/or the mask by which the electron beam pattern is produced. Such electrical correction can be achieved by using the error signals to modify the current in deflection and/or focussing coils of an electron beam machine so as to direct the electron beam pattern into correct alignment with the silicon slice. The manner in which this would be achieved does not form part of the present invention and so will not be described in detail herein. Electron beam machine techniques for deflecting and focussing electron beam patterns using electronic computer control are already known, and the programming which would be necessary to correct for misalignment in response to error signals as produced in the manner of the invention could be effected readily by a person skilled in the art using known techniques.

Figure 5:
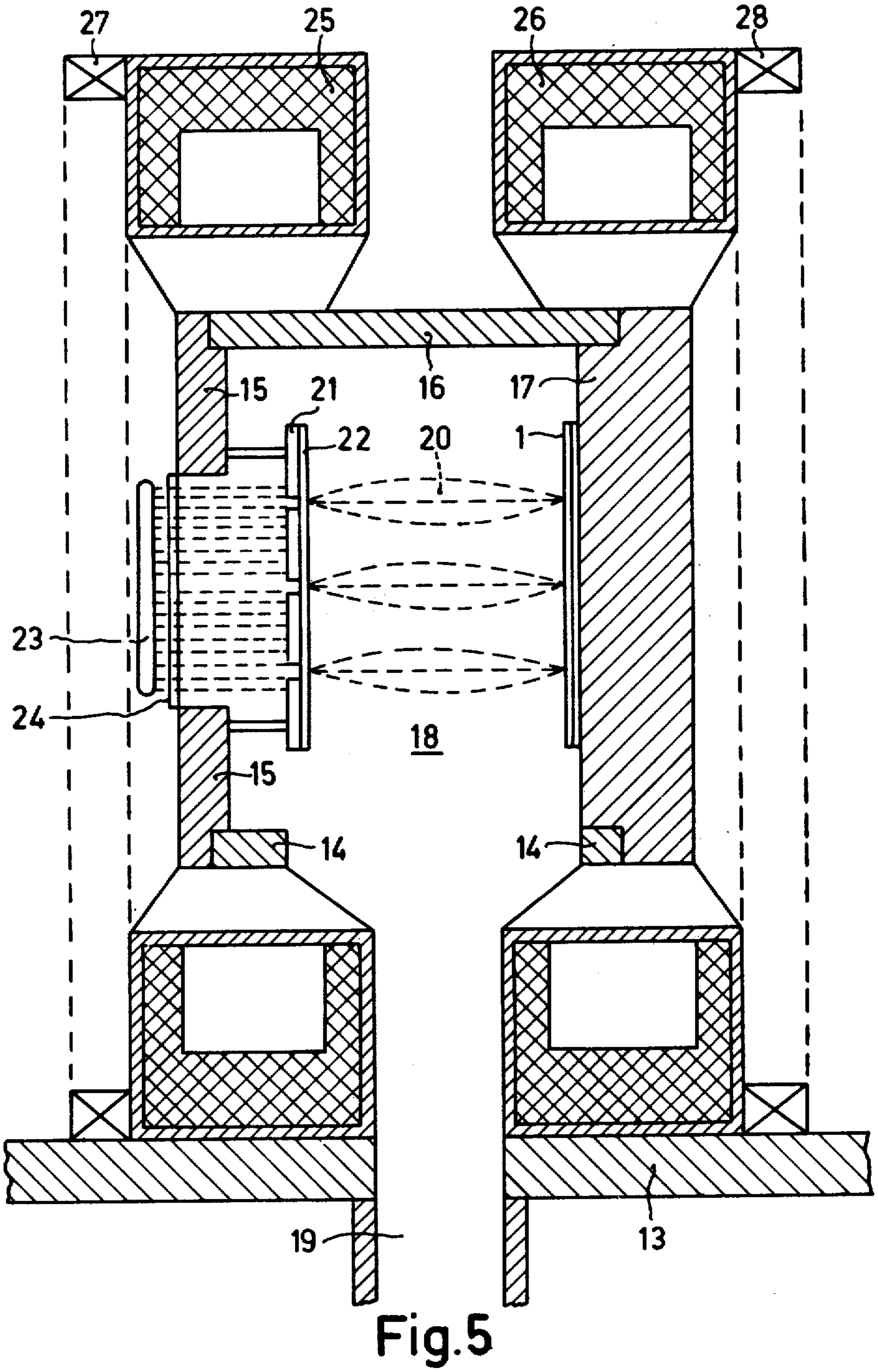
FIG. 5 shows diagrammatically a general layout of an electron beam machine for semiconductor device manufacture.

A general layout of a typical electron beam machine is shown diagrammatically in FIG. 5. The machine is mounted on a base 13 and comprises vacuum walls 14, 15, 16 and 17 which define a working region 18 which can be evacuated by means of a vacuum pump (not shown) via an aperture 19 in the base 13. The wall 17 forms a holder on which a silicon slice 1 can be mounted for irradiation by an electron beam pattern 20. The electron beam pattern 20 is defined by a mask 21 suitably made of chromium, which has coated on it a photo-cathode layer 22, suitably of cesium iodide. A discharge lamp 23 forms a source of ultra-violet radiation which is transmitted through an ultra-violet window 24 to the mask 21. The photo-cathode layer 22 is excited by the ultra-violet radiation where the latter passed through apertures in the pattern mask and thereby emits a corresponding electron beam pattern 20. The electron beam pattern is accelerated by a high voltage electric field from the photo-cathode layer 22 to the silicon slice 1 in an axial magnetic field which is generated by focus coils 25 and 26. Deflection coils 27 and also further deflection coils (not shown) at right angles thereto provide mutually perpendicular deflecting magnetic fields for accurately positioning the focussed electron beam pattern 20 with respect to the silicon slice 1. Further coils (also not shown) can be provided for rotational correction of the electron beam pattern, on this correction can be effected by means of the focus coils.

In view of the ability of the arrangement by which the present invention is performed of providing a change in hole current in a p-type region for a change in the position of irradiation by an electron beam of an adjacent n-type region, it is envisaged that such an arrangement could have application generally as an amplifier device in which an input current is applied to an electron beam deflection coil to produce a change in output current from the p-type region due to the point of irradiation of the n-type region being moved due to the resulting electron beam deflection.

What is claimed is:

1. A method of aligning a semiconductor body with respect to an electron beam pattern, comprising for each direction with respect to which alignment is desired, the steps of:

forming on the semiconductor body a reference marker having two outer regions of one conductivity type semiconductor material separated by an intermediate region of opposite conductivity type semiconductor material;

forming an alignment electron beam positionally fixed relative to the electron beam pattern and suitably cross-sectioned such that when the electron beam pattern is aligned with respect to the semiconductor body, said alignment electron beam strikes said intermediate region midway between said two outer regions causing thereby equal currents diffusing thereto from each of said two outer regions;

comparing the currents diffusing into said intermediate region from each of said two outer regions;

adjusting the relative position of the electron beam pattern with respect to the semiconductor body until said compared currents are equal.

2. The method defined in claim 1 wherein said two outer regions of said reference marker are substantially identical and positioned symmetrically to each other about a line perpendicular to the direction with respect to which alignment is desired.

3. The method defined in claim 2 wherein said alignment electron beam projects onto said intermediate region an elongate alignment pattern, the longitudinal direction of which lies on and is parallel to said perpendicular line when the electron beam pattern is aligned with respect to the semiconductor body.

4. A method as defined in claim 3 wherein said two outer regions of said reference marker are formed on the semiconductor body by diffusing at least one impurity into the semiconductor body at two spaced apart regions, the portion of the semiconductor body therebetween acting as said intermediate region.

5. A method as defined in claim 4 wherein said two outer regions are defined and diffused as part of the first diffusion step in the manufacture of a semiconductor device.

6. A method as defined in claim 3 wherein each of said two outer regions further include an offset portion thereof to which a metal contact is applied for electrical connection to said outer regions.

7. A method as defined in claim 6 wherein said offset portions are positioned symmetrically to each other about said perpendicular line.

8. A method as defined in claim 6 where in said comparing step a differential amplifier is connected to said metal contacts to compare the currents diffusing from said two outer regions.

9. A method as defined in claim 3 wherein the semiconductor body is round and four evenly spaced reference markers are formed about the periphery thereof.

10. A method as defined in claim 6 wherein said offset portions are positioned symmetrically to each other about said perpendicular line.

11. A method as defined in claim 3 wherein the semiconductor body is round and four evenly spaced reference markers are formed about the periphery thereof.

12. A method of aligning a semiconductor body with respect to an electron beam pattern formed by projecting an electron beam through a mask, comprising for each direction with respect to which alignment is desired, the steps of:

forming on the semiconductor body a reference marker having two outer regions of one conductivity type semiconductor material separated by an intermediate region of opposite conductivity type semiconductor material;

forming an aligning aperture in the mask having a suitable size, shape and position such that when the electron beam pattern is aligned with respect to the semiconductor body, an electron beam projecting through said aligning aperture strikes said intermediate region midway between said two outer regions causing thereby equal currents diffusing thereto from each of said two outer regions;

comparing the currents diffusing into said intermediate region from each of said two outer regions;

adjusting the relative position of the electron beam pattern with respect to the semiconductor body until said compared currents are equal.

13. The method defined in claim 12 wherein said two outer regions of said reference marker are substantially identical and positioned symmetrically to each other about a line perpendicular to the direction with respect to which alignment is desired.

14. The method defined in claim 13 wherein said aligning aperture is slit shaped and positioned to project onto said intermediate region an elongate electron beam, which lies on and is parallel to said perpendicular line when the electron beam pattern is aligned with respect to the semiconductor body.

15. A method as defined in claim 14 wherein said two outer regions of said reference marker are formed on the semiconductor body by diffusing at least one impurity into the semiconductor body at two spaced apart regions, the portions of the semiconductor body therebetween acting as said intermediate region.

16. A method as defined in claim 15 wherein said two outer regions are defined and diffused as part of the first diffusion step in the manufacture of a semiconductor device.

17. A method as defined in claim 14 wherein each of said two outer regions further include an offset portion thereof to which a metal contact is applied for electrical connection to said outer regions.

18. A method as defined in claim 17 where in said comparing step a differential amplifier is connected to said metal contacts to compare the currents diffusing from said two outer regions.

* * * * *